United States Patent [19]
Nakayama et al.

[11] Patent Number: 5,283,758
[45] Date of Patent: Feb. 1, 1994

[54] NON-VOLATILE SEMICONDUCTOR MEMORY DEVICE

[75] Inventors: Takeshi Nakayama; Yasushi Terada; Kazuo Kobayashi; Masanori Hayashikoshi; Yoshikazu Miyawaki, all of Hyogo, Japan

[73] Assignee: Mitsubishi Denki Kabushiki Kaisha, Tokyo, Japan

[21] Appl. No.: 794,708

[22] Filed: Nov. 20, 1991

Related U.S. Application Data

[63] Continuation of Ser. No. 536,876, Jun. 12, 1990, abandoned.

[30] Foreign Application Priority Data

Jun. 13, 1989 [JP] Japan .................. 1-150884

[51] Int. Cl.$^5$ .............................. G11C 11/34
[52] U.S. Cl. ...................... 365/185; 365/218; 365/230.03; 365/230.06; 365/900; 365/195
[58] Field of Search .............. 365/185, 218, 230.03, 365/230.06, 900, 195

[56] References Cited

U.S. PATENT DOCUMENTS

| | | | |
|---|---|---|---|
| 4,677,590 | 6/1987 | Arakawa | 365/185 |
| 4,751,678 | 6/1988 | Raghunathan | 365/218 |
| 4,870,615 | 9/1989 | Maruyama et al. | 365/185 |
| 4,907,198 | 3/1990 | Arima | 365/185 |
| 4,939,690 | 7/1990 | Momodomi et al. | 365/218 |
| 4,970,692 | 11/1990 | Ali et al. | 365/218 |
| 5,034,926 | 7/1991 | Taura et al. | 365/218 |

OTHER PUBLICATIONS

Esquivel, J. et al., "High Density Contactless, Self Aligned EPROM Cell Array Technology," *IEEE*, IEDM 86 (1986), pp. 593–596.

Mitchell, A. et al., "A New Self-Aligned Planar Array Cell for Ultra High Density EPROMs," *IEEE*, IEDM 87 (1987), pp. 548–551.

*Primary Examiner*—Joseph E. Clawson, Jr.
*Attorney, Agent, or Firm*—Lowe, Price, LeBlanc & Becker

[57] ABSTRACT

A plurality of memory cell transistors having floating gates are disposed in a matrix in the direction of row and column to form a memory cell array. The memory cell array is divided into a plurality of sectors for every predetermined row. In each sector, sector selecting transistors and sub bit lines are provided, so that erasing and programming can be made for each sector. Therefore, total erasing for sector becomes possible, and since no voltage is applied to sub bit lines and word lines of non-selected sectors, the number of operations of preventing writing into non-selected memory cells is as many as the word lines included in one sector.

17 Claims, 8 Drawing Sheets

NON-VOLATILE SEMICONDUCTOR MEMORY DEVICE

This application is a continuation of application Ser. No. 07/536,876 filed Jun. 12, 1990 abandoned.

BACKGROUND OF THE INVENTION

1. Field of the Invention

The present invention relates generally to non-volatile semiconductor memory devices, and more particularly, to an electrically erasable and programmable non-volatile semiconductor memory device employing a so-called floating gate-type transistor as a memory cell.

2. Description of the Background Art

Figure 1A:
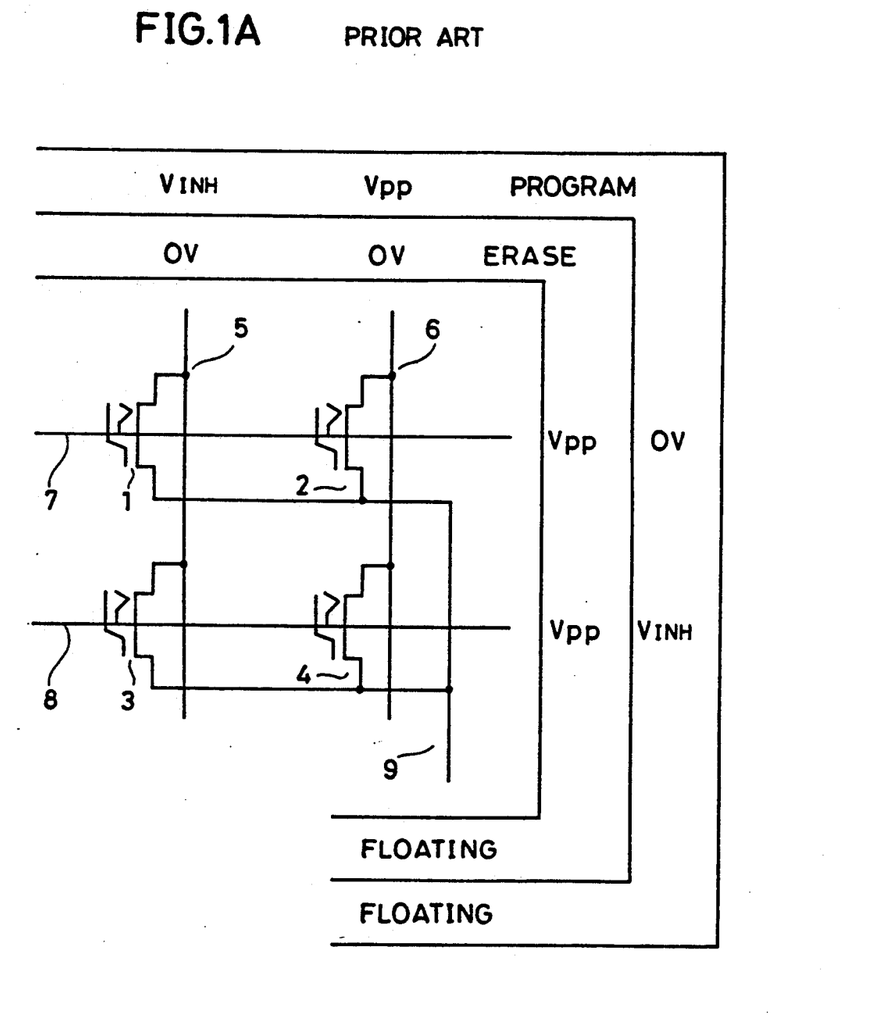
FIG. 1A is a diagram showing a part of a memory cell array structure and its conditions of writing voltage in a conventional non-volatile semiconductor memory device in a conventional non-volatile semiconductor memory device.
Figure 1B:
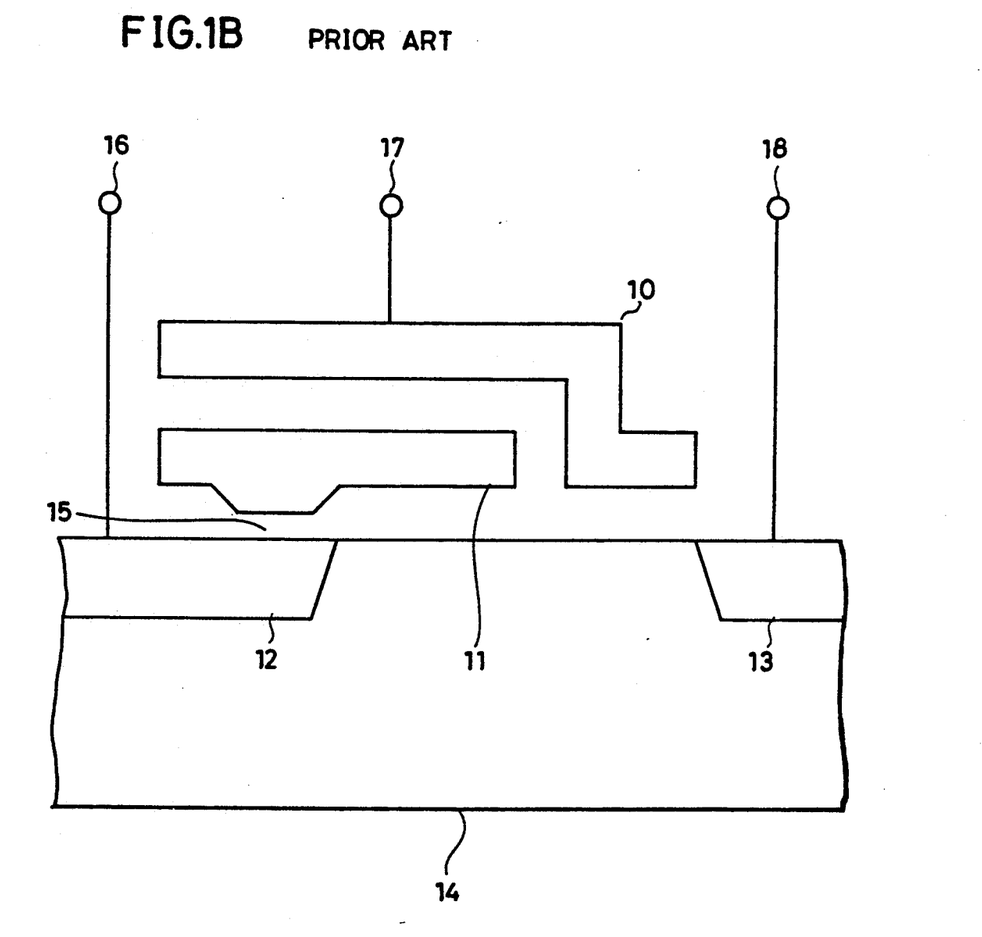
FIG. 1B is a diagram showing a sectional structure of a memory cell employed in a conventional device and a device according to an embodiment of the present invention.

FIG. 1A is a diagram including a circuit diagram of four memory cells in a memory cell array and its writing voltage application requirements of a conventional non-volatile semiconductor memory device described in "1988 Symposium on VLSI Circuits, Digest of Technical Papers" pp 81-82. FIG. 1B is a sectional view of a memory cell employed in the non-volatile semiconductor memory device of FIG. 1A. Since in this memory cell, a selecting transistor and a memory transistor are integrated as a single device, a control gate extends in the direction of a source so as to serve as a selecting transistor. In addition, since two transistors are integrated as a single device, a writing blocking voltage needs to be applied in programming.

In FIG. 1A, memory cells 1, 2, 3 and 4 are arranged in matrix in the direction of rows and columns, and constitute a memory cell array. Bit lines are provided in each column of the memory cell array, and word lines are provided in each row. In FIG. 1A, a bit line 5 is provided in a column of the memory cells 1 and 3, and a bit line 6 is provided in a column of the memory cells 2 and 4. Respective drains of the memory cells 1 and 3 are connected to the bit line 5, and respective drains of the memory cells 2 and 4 are connected to the bit line 6. A word line 7 is provided in a row of the memory cells 1 and 2, and a word line 8 is provided in a column of the memory cells 3 and 4. The word line 7 is connected to respective control gates of the memory cells 1 and 2, and the word line 8 is connected to respective control gates of the memory cells 3 and 4. Each source of the memory cells 1-4 is connected to a source line 9. The requirements of application of writing voltage shown in FIG. 1A are for a case where the memory cells 1-4 are erased (writing of "1"), and the memory cell 2 is programmed (writing of "0").

As shown in FIG. 1B, each of the memory cells 1-4 shown in FIG. 1A comprises a control gate 10, a floating gate 11, a drain 12, a source 13, a semiconductor substrate 14, a tunnel oxide film 15, a drain electrode 16, a control gate electrode 17 and a source electrode 18. As described above, the drain electrode 16 is connected to the bit line 5 or 6, the control gate electrode 17 is connected to the word line 7 or 8, and the source electrode 18 is connected to the source line 9.

Now, operation of a conventional non-volatile semiconductor memory device shown in FIG. 1A will be described. In general, in a non-volatile semiconductor memory device there are three fundamental operations of erasing, programming and reading.

First, an erasing operation will be described. In the conventional circuit of FIG. 1A, erasing operation is done for the entire chip. More specifically, all the memory cells included in one chip non-volatile semiconductor memory device are collectively erased, wherein a high-voltage $V_{PP}$ is applied to all the word lines 7 and 8 in the chip, and 0 V is applied to all the bit lines 5 and 6, to hold the source line 9 in floating state. Since in this state, the high voltage $V_{PP}$ is applied between each drain 12 of the memory cells 1, 2, 3 and 4, and each control gate 10, high electric field is formed in the tunnel oxide film 15 between the drains 12 and the floating gate 11. Due to the high electric field, electron tunnels from the drain 12 to the floating gate 11 through the tunnel films to be stored in the floating gates 11. As a result, threshold voltages of all the memory cells 1, 2, 3 and 4 with respect to the control gates 10 become higher ("1" is written) compared with those before erasing.

Now, programming operation will be described. In the conventional circuit of FIG. 1A, programming operation is made on a page basis (on a word line basis). Description will be given of an example in which the word line 7 is selected so that "0" is written in the memory cell 2 connected thereto, and other memory cells 1, 3 and 4 do not change. Voltage of 0 V is applied to the selected word line 7, and a writing blocking voltage $V_{INH}$ is applied to the non-selected word line 8, and a writing blocking voltage $V_{INH}$ is applied to the bit line 5 and the high voltage $V_{PP}$ is applied to the bit line 6, to hold the source line 9 held in floating gate state. Since in this state, the high voltage $V_{PP}$ is applied between the control gate 10 and the drain 12 of the memory cell 2, high electric field is generated between the floating gate 11 and the drain 12. Due to the high electric field, electron tunnels from the floating gate 11 to the drain 12 through the tunnel oxide film 15, so that the floating gate 11 is brought into a depletion state of electrons. Therefore, a threshold voltage of the memory cell 2 with respect to the control gate becomes lower than that before programming ("0" is written). In addition, although voltages of ($V_{INH}-0$ V) and ($V_{PP}-V_{INH}$) are applied between the control gate 10 and the drain 12 of the memory cells 1 and 4, respectively, fluctuation of threshold voltage is negligible, since they are sufficiently smaller than the high voltage $V_{PP}$ in the memory cell 2. In the memory cell 3, as the writing blocking voltages $V_{INH}$ are applied to both the control gate 10 and the drain 12, potentials are not different, so that threshold voltages do not fluctuate. More specifically, the states of the memory cells 1, 3 and 4 do not change.

Next, the reading operation will be described. Reading is performed by detecting, by means of a sense amplifier (not shown) connected to a bit line, whether current flows from a drain to a source of a memory cell. "0" corresponds to a current flow, and "1" corresponds to no current flow. Now, reading operation of information written in the memory cell 2 will be described. A voltage approximate to a power supply voltage is applied to the selected word line 7, voltage of 0 V is applied to the non-selected word line 8, a reading voltage approximate to 1-2 V is applied to the bit line 6, a voltage of 0 V applied to the bit line 5, and a voltage of 0 V is applied to the source line 9. When "0" is written into the memory cell 2 (when a threshold voltage of a memory cell is low), channels are formed under the floating gate 11, and channels are formed also under the control gate 10 due to the voltage of the selected word line 7 so that, if a reading voltage is applied to the bit line 6, a current flows from the drain 12 to the source 13. When "1" is written in the memory cell 2 (a threshold voltage of a memory cell is high), no channel is formed under the floating gate 11, so that no current flows even if channels are formed under the control gate by the voltage of the selected word line 7.

As described in the foregoing, in a conventional non-volatile semiconductor memory device, erasing is lumped together for chip, and thereafter, programming is made on a page basis. For example, in the case of a memory cell array having 512 word lines, since programming is made on a page (word line) basis after total erasing is made for 512 word lines, writing of non-selected memory cells should be prevented at the maximum of 512 times. That is, the conditions of the memory cell 4 of FIG. 1A, $(V_{PP}-V_{INH})$ is applied 511 times, and the condition of the memory cell 1, $(V_{INH}-0 V)$ is applied once.

A potential difference between a drain and a control gate of a non-selected memory cell transistor during programming is shown in the following table.

|  | $V_{INH} = \frac{1}{2} V_{PP}$ | $V_{INH} = \frac{1}{3} V_{PP}$ | $V_{INH} = \frac{2}{3} V_{PP}$ |
|---|---|---|---|
| Transistor 1 | $\frac{1}{2} V_{PP}$ | $\frac{1}{3} V_{PP}$ | $\frac{2}{3} V_{PP}$ |
| Transistor 3 | 0 V | 0 V | 0 V |
| Transistor 4 | $\frac{1}{2} V_{PP}$ | $\frac{2}{3} V_{PP}$ | $\frac{1}{3} V_{PP}$ |

In the table, when the writing blocking voltage $V_{INH}$ is, for example, $(\frac{1}{2})V_{PP}$, potential differences between drains and control gates of the transistors 1, 3 and 4 are $(\frac{1}{2})V_{PP}$, 0 V and $(\frac{1}{2})V_{PP}$, respectively. When the writing blocking voltage $V_{INH}$ is $(\frac{1}{3})V_{PP}$, potential differences between the drains and the control gates of the transistors 1, 3 and 4 are $(\frac{1}{3})V_{PP}$, 0 V and $(\frac{2}{3})V_{PP}$, respectively.

As described in the foregoing, a conventional non-volatile semiconductor memory device has many word lines and erasing can only be done together on a chip basis, preventing of writing into non-selected memory cells needs to be performed as many times as the number of word lines. Consequently, the margin for fluctuation of voltage when writing is prevented is extremely small. More specifically, since information in non-selected memory cells is destroyed if a voltage for preventing writing fluctuates even one of all the preventing operations of writing into non-selecting memory cells, voltage value for preventing writing needed to be defined very precisely.

Figure 2:
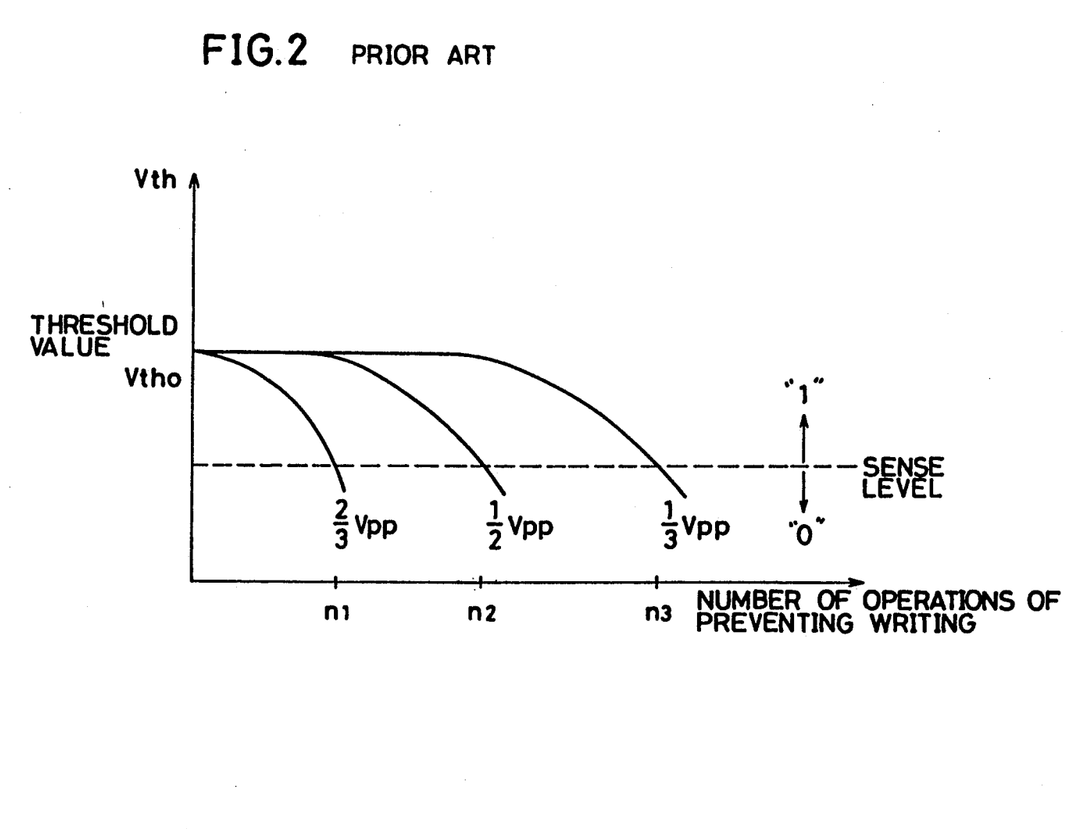
FIG. 2 is a graph showing a relation between the number of operations of preventing writing into a transistor of a non-selected memory cell and a threshold voltage $V_{th}$ of the transistor during programming.

FIG. 2 is a graph showing a relation between the number of operations of preventing writing into a transistor of a non-selected memory cell and a threshold voltage Vth of the transistor during programming. As shown in the graph, as the number of operations of preventing writing is increased, the threshold voltage Vth drops, and logic of information stored in the memory cell transistor is inverted from "1" to "0" over a certain number of operations. A critical number of operations depends on a potential difference applied between a drain and a control gate of the memory transistor, that is, the critical number of operations is reduced as the potential difference is increased. In order to prevent destruction of the stored information of non-selected memory cell, the number of operations of preventing writing into the non-selected memory cell should be held below this critical number of operations. In other words, if the number of operations of prevent-ing writing is n2, a potential difference between the drain and the control gate has a margin of $(\frac{1}{2})V_{PP}$ to 0 V.

SUMMARY OF THE INVENTION

The present invention is for solving the above described problems and its object is to provide a non-volatile semiconductor memory device in which total erasing can be made for sector (for several word lines), and the number of operations of preventing writing into non-selected memory cells during programming can be reduced.

The non-volatile semiconductor memory device according to the present invention comprises a plurality of memory cell transistors disposed in matrix in the direction of rows and columns, and a memory cell array divided into a plurality of sectors for every predetermined rows. Each memory cell transistor comprises a drain, a source, a control gate and a floating gate. A non-volatile semiconductor memory device according to the present invention comprises a plurality of word lines provided in each row of a memory cell array and connected to control gates of memory transistors in a corresponding row, a plurality of main bit lines provided in each column of the memory cell array, a plurality of sub bit lines provided in each column of each sector of the memory cell array and connected to drains of memory cell transistors in a corresponding sector and column, a plurality of sector selecting transistors which predetermined number is provided in each sub bit line, each having a drain connected to a main bit line of a corresponding column and a source connected to a corresponding sub bit line, and a plurality of sector selecting lines provided in each sector of the memory cell array, and each connected to a gate of a sector selecting transistor in a corresponding sector.

In another aspect of the present invention, the above sub bit lines are connected to drains of memory cell transistors of a corresponding sector and column and to sources of memory cell transistors in adjacent columns.

In the present invention, while a memory cell array on a single chip is divided, every predetermined number of rows into a plurality of sectors wherein sector selecting transistors are provided, so that total erasing can be made for sector, a voltage for preventing writing is applied only to non-selected memory cells of a sector to which a selected memory cell belongs so as to reduce the number of operations of preventing writing into each memory cell.

More specifically, according to the present invention, since erasing and programming are performed only for a selected sector, erasing on a sector basis becomes possible. Additionally, since no voltage is applied to sub bit lines and word lines of non-selected sectors, the number of operations of preventing writing into non-selected memory cells is only as many as the number of word lines included in one sector. Accordingly, the number of operations of preventing writing is reduced and margin for voltage fluctuation during prevention of writing is increased as compared with that of a conventional non-volatile semiconductor memory device.

In addition, according to a variation of the invention, since a drain and a source of a memory cell may be connected between adjacent sub bit lines, there will be no need to interconnect a source of each memory cell transistor, so that interconnecting process can be simplified and a circuit area can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 3:
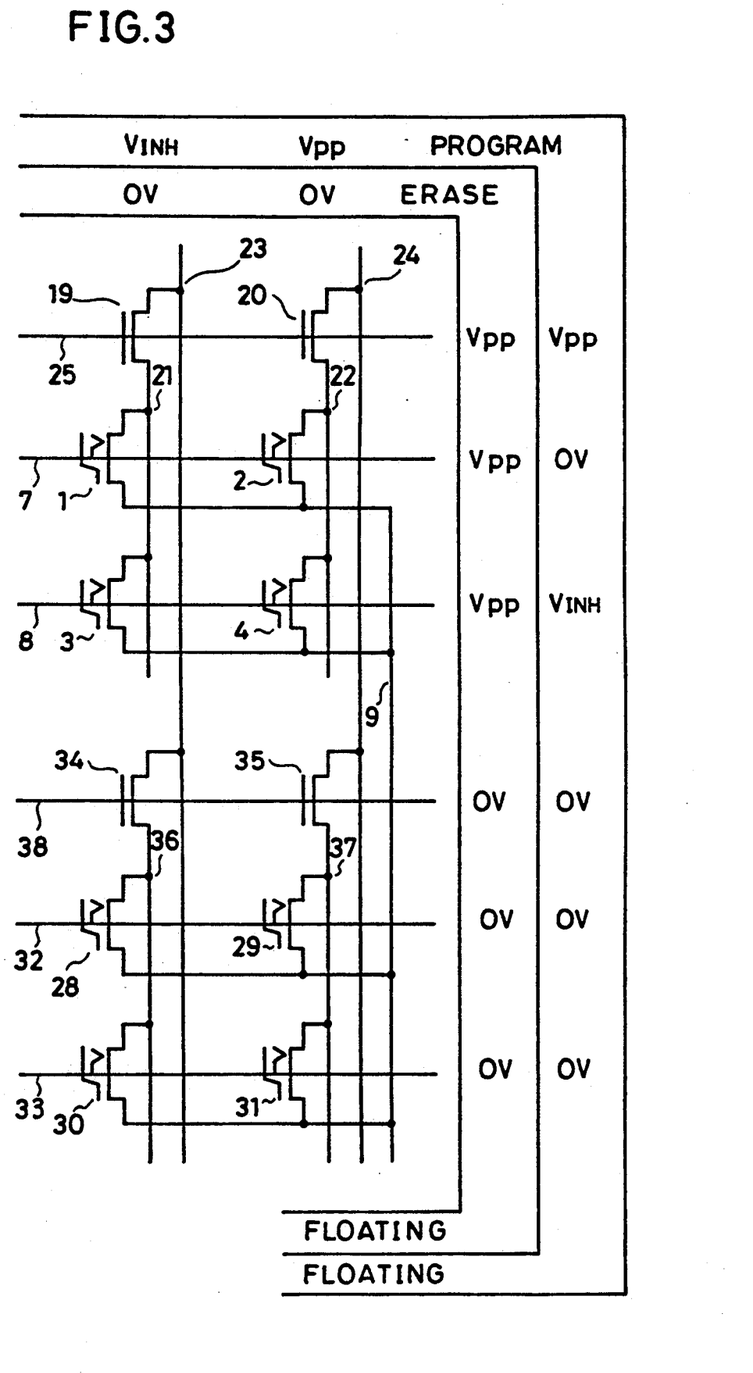
FIG. 3 is a diagram showing a part of memory cell array structure and its conditions of writing voltage in the first embodiment of the present invention.

FIG. 3 is a diagram showing a part of a memory cell array structure in one embodiment of the present invention. More specifically, FIG. 3 shows a circuit diagram of eight memory cells and conditions of writing voltage. In the drawing, memory cells 1, 2, 3, 4, 28, 29, 30 and 31 are disposed in matrix in the direction of row and column. Each memory cell comprises floating gate-type transistors. In the memory cell array, word lines 7, 8, 32 and 33 are provided in each row, each connected to a control gate of each memory cell in a corresponding row. In addition, main bit lines 23 and 24 are provided in each column of the memory cell array, wherein the memory cell array is divided into a plurality of the sectors every predetermined rows. In FIG. 3, a first sector including the word lines 7 and 8, and a second sector including the word lines 32 and 33 are shown. In each sector, sector selecting transistors 19, 20, 34 and 35 are provided in each column. In addition, sub bit lines 21, 22, 36 and 37 are provided in each column of each sector. Each sector selecting transistor has its drain connected to a main bit line of the corresponding column, and its source connected to a sub bit line of the corresponding column. For example, the sector selecting transistor 19 has its drain connected to the main bit line 23 of the corresponding column, and its source connected to the sub bit line 21 of the corresponding column. In each sector, sector selecting lines 25 and 38 are provided to be connected to gates of the sector selecting transistors of the corresponding sector. More specifically, the sector selecting line 25 is connected to each gate of sector selecting transistors 19 and 20, and the sector selecting line 38 is connected to each gate of the sector selecting transistors 34 and 35. Each source of all the memory cells is connected in common to the source line 9.

Now, the operation of the embodiment shown in FIG. 3 will be described, wherein a sector including memory cells 1, 2, 3 and 4 is represented as a selected sector, and a sector including memory cells 28, 29, 30 and 31 is represented as a non-selected sector.

First, the erasing operation will be described. Erasing can be made for sector, wherein a high voltage $V_{PP}$ or 5 V is applied to the sector selecting line 25 of the selected sector, the high voltage $V_{PP}$ is applied to all the word lines 7 and 8 of the selected sector, and 0 V is applied to the main bit lines 23 and 24, so that the source line 9 is held in floating gate state or at 0 V. At this time, the voltage of 0 V is applied to the sector selecting line 38 and all the word lines 32 and 33 of the non-selected sector. Since in this state, sector selecting transistors 19 and 20 are in on state, the sub bit lines 21 and 22 attains 0 V, the same potential of the main bit lines 23 and 24. Then, the high voltage $V_{PP}$ is applied between the drains 12 and the control gates 10 of the memory cells 1, 2, 3 and 4, so that in the same manner as the prior art, threshold voltages of the memory cells 1, 2, 3 and 4 become higher than those before erasing operation. On the other hand, since the sector selecting line 38 is 0 V and the word lines 32 and 33 are also 0 V, in the non-selected sector, states of the memory cells in the second sector do not change.

Now, the programming operation will be described. Programming is made for page (for word line), similar to the prior art. Now description is given of a case where "0" is written into the memory cell 2, and states of other memory cells 1, 3 and 4 do not change. The high voltage $V_{PP}$ is applied to the sector selecting line 25, 0 V is applied to the selected word line 7, the voltage for preventing writing $V_{INH}$ is applied to the non-selected word line 8, the voltage for preventing writing $V_{INH}$ is applied to the main bit line 23, and the high voltage $V_{PP}$ is applied to the main bit line 24, to hold the source line 9 in floating state. At this time, the sector selecting line 38 and all the word lines 32 and 33 of the non-selected sector are at 0 V. Since in this state, sector selecting transistors 19 and 20 are in ON state, the sub bit line 21 attains the same voltage $V_{INH}$ as that of the main bit line 23, and the sub bit line 22 attains the same voltage $V_{PP}$ as that of the main bit line 24. Then, the high voltage $V_{PP}$ is applied between the control gate 10 and drain 12 of the memory cell 2, so that similar to the prior art, the threshold voltage of the memory cell 2 becomes low. Since the other memory cells 1, 3 and 4 attain the same voltage as those of the prior art, the threshold voltage do not change. In addition, since the sector selecting line 38 of the non-selected sector is at 0 V, and the word lines 32 and 33 are also at 0 V, the states of the memory cells do not change.

Now, the reading operation will be described wherein information of the memory cell 2 is read out. A voltage approximate to the power supply voltage is applied to the sector selecting line 25, thereby applying a voltage approximate to the power supply voltage to the selected word line 7, 0 V to the non-selected line 8, 0 V to the main bit line 23 and a reading voltage approximate to 1-2 V to the sub bit line 24, so that 0 V is applied to the source line 9. Since in this state, the sector selecting transistor is in ON state, the same reading voltage as that of the main bit line 24 is applied to the sub bit line 22, and therefore, information of the memory cell 2 is read out similar to the prior art. On the other hand, since the sector selecting line 38 is at 0 V in the non-selected sector, sub bit lines 36 and 37 in the non-selected sector are not connected to the main bit lines 23 and 24.

As described above, according to the embodiment of FIG. 3, since erasing and programming are made only for a selected sector, total erasing for one sector becomes possible. Also since no voltage is applied to sub bit lines and word lines in a non-selected sector, the number of operations of preventing of writing into memory cells in the non-selected sector is as large as the number of word lines included in one sector. For example, if one sector has eight word lines, inhibiting writing into non-selected memory cells must to be performed at a maximum of 8 times, so that the margin for fluctuation of voltage for preventing writing is added about two digits. In addition, since in reading the number of sub bit lines connected to a main bit line is only one, stray capacity of bit lines becomes smaller compared with that of the prior art, thereby gaining reading speed.

Although, in the embodiment of FIG. 3, the main bit lines 23 and 24 are formed of metal wires such as aluminum, or polycrystal silicon, the sub bit lines 21, 22, 36 and 37 are preferably formed of impurity diffusion layers so as to increase the degree of integration. However, if sub bit lines are formed of impurity diffusion layers, the resistance value is larger compared with that of metal wires, so that reading speed of memory cells becomes different depending on where memory cells are located. More specifically, the further from a sector selecting transistor a memory cell is located, the slower its reading speed becomes.

Figure 4:
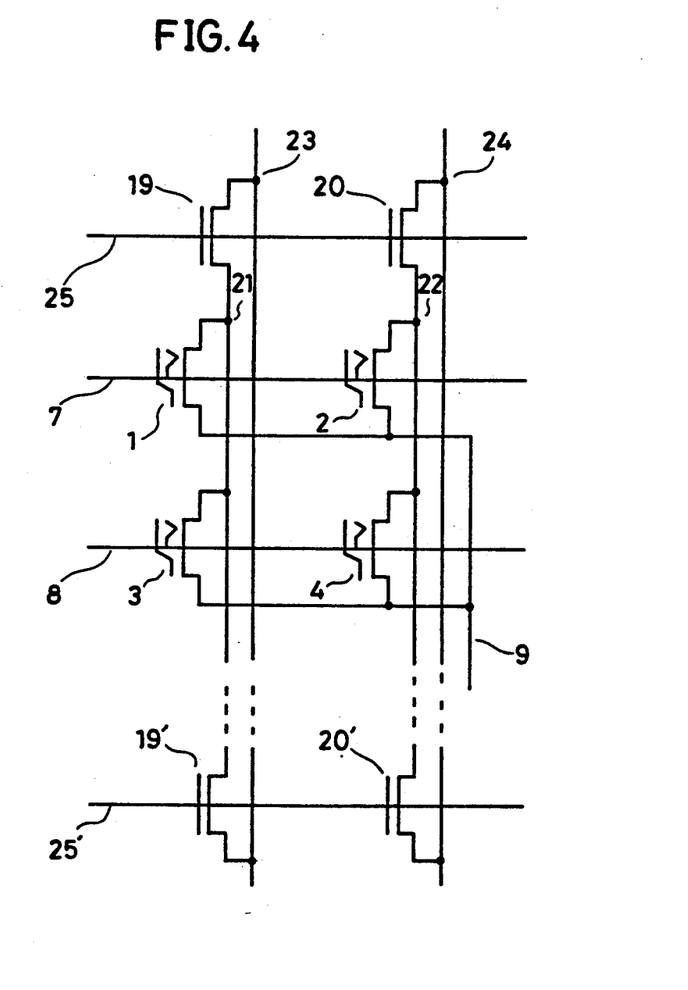
FIG. 4 is a diagram showing a part of a memory cell array structure in the second embodiment of the present invention.

FIG. 4 is a diagram showing a structure of the second embodiment of the present invention achieved for solving such a problem as occurs in the embodiment of FIG. 3. FIG. 4 shows a structure of one sector in a memory cell array. In the drawing, two sector selecting transistors are provided in each column of the sector. More specifically, two sector selecting transistors 19 and 19' are provided in a row corresponding to the memory cells 1 and 3, and sector selecting transistors 20 and 20' are provided in a column corresponding to the memory cells 2 and 4. In each column of the sector, these two sector selecting transistors are preferably located on the opposite ends of the corresponding sub bit line. For example, the sector selecting transistor 19 is disposed on one end of the sub bit line 21, and the transistor selecting sector 19' is disposed on the other end of the sub bit line 21, while the sector selecting transistor 21 is disposed on one end of the sub bit line 22, and the sector selecting transistor 20' is disposed on the other end of the sub bit line 22. For newly added sector selecting transistors 19' and 20', a sector selecting line 25' is provided, which is connected to each gate of the corresponding sector selecting transistors 19' and 20'. Sector selecting lines 25 and 25' are connected into one (not shown), and supplied with the same sector selecting signal. The rest of the structure is the same as that of the embodiment shown in FIG. 3, and thus the same reference numerals are given to the corresponding parts.

According to the structures as shown in FIG. 4, resistance value due to a sub bit line, between a corresponding main bit line and a selected memory becomes almost the same irrespective of the location of selected memory cell so that variation of reading speed is reduced.

The embodiment of FIG. 4 otherwise has the similar effect to that of the foregoing embodiment of FIG. 3.

Although in the embodiment of FIG. 4, two sector selecting transistors are provided in one column of the same sector, three or more sector selecting transistors may be provided. In addition, in the embodiment of FIG. 4, in the same column of the same sector, two sector selecting transistors are disposed on opposite ends of the corresponding sub bit line, respectively. Thus, variation of reading speed is most effectively reduced, however, the sector selecting transistors may be disposed in other positions, and even in this case, variation of reading speed can be reduced. This is also the case in which three or more than three sector selecting transistors are provided in the same column of the same sector.

Figure 5:
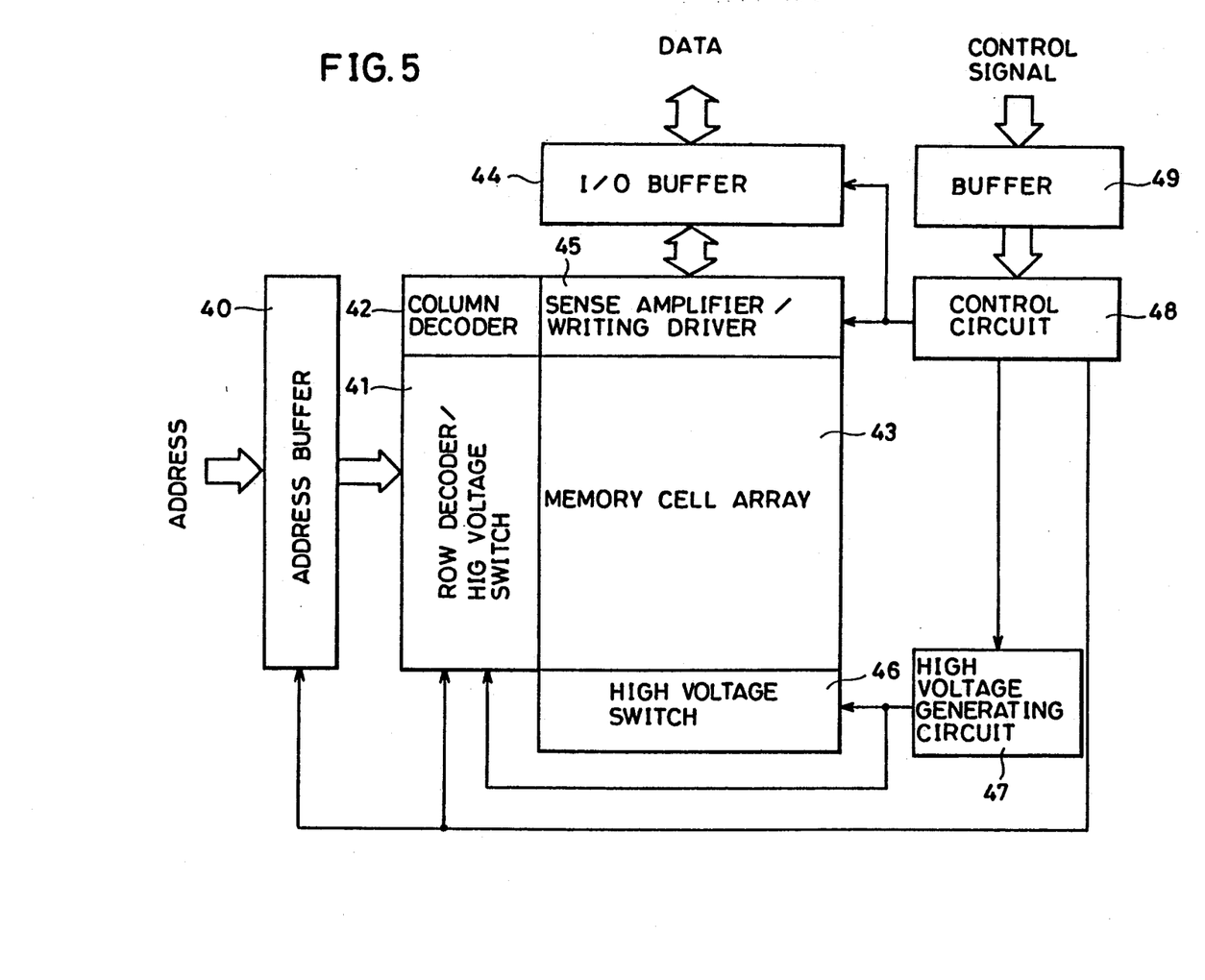
FIG. 5 is a block diagram showing a structure of peripheral circuits for driving the embodiment shown in FIG. 3 or in FIG. 4.

FIG. 5 is a block diagram showing a structure of peripheral circuits for driving the memory cell array of the embodiment shown in FIG. 3 and FIG. 4, wherein the structure is loaded in one chip. In the drawing, externally inputted address data is applied to a row decoder 41 and a column decoder 42 through an address buffer 40, thereby selecting a word line, a main bit line and a sector in a memory cell array 43. The embodiment shown in FIG. 3 and FIG. 4 shows a part of the structure of this memory cell array 43. On the other hand, externally inputted data is applied to a writing driver 45 through an I/0 buffer 44. The writing driver 45 applies the data to a main bit line selected by the column decoder 42, so that the data is written into the selected memory cell. At this time, the high voltage switches 41 and 46 apply the high voltage $V_{PP}$ generated by a high voltage generating circuit 47 to specific word line and bit line designated by an address from the address buffer 40. In reading, data stored in a memory cell selected by the row decoder 41 and the column decoder 42 is externally outputted through the I/O buffer 44 after amplified by the sense amplifier 45. A control circuit 48 generates various timing signals based on a control signal applied from the external through a buffer 49, so as to control operation of the address buffer 40, the row decoder/high voltage switch 41, the I/O buffer 44, the sense amplifier/writing driver 45 and the high voltage generating circuit 47.

On the other hand, in the embodiment shown in FIGS. 3 and 4, each source of the memory cell transistors needs to be interconnected to a single source line 9. Therefore, the interconnecting process becomes complicated, so that circuit area is increased.

Figure 6:
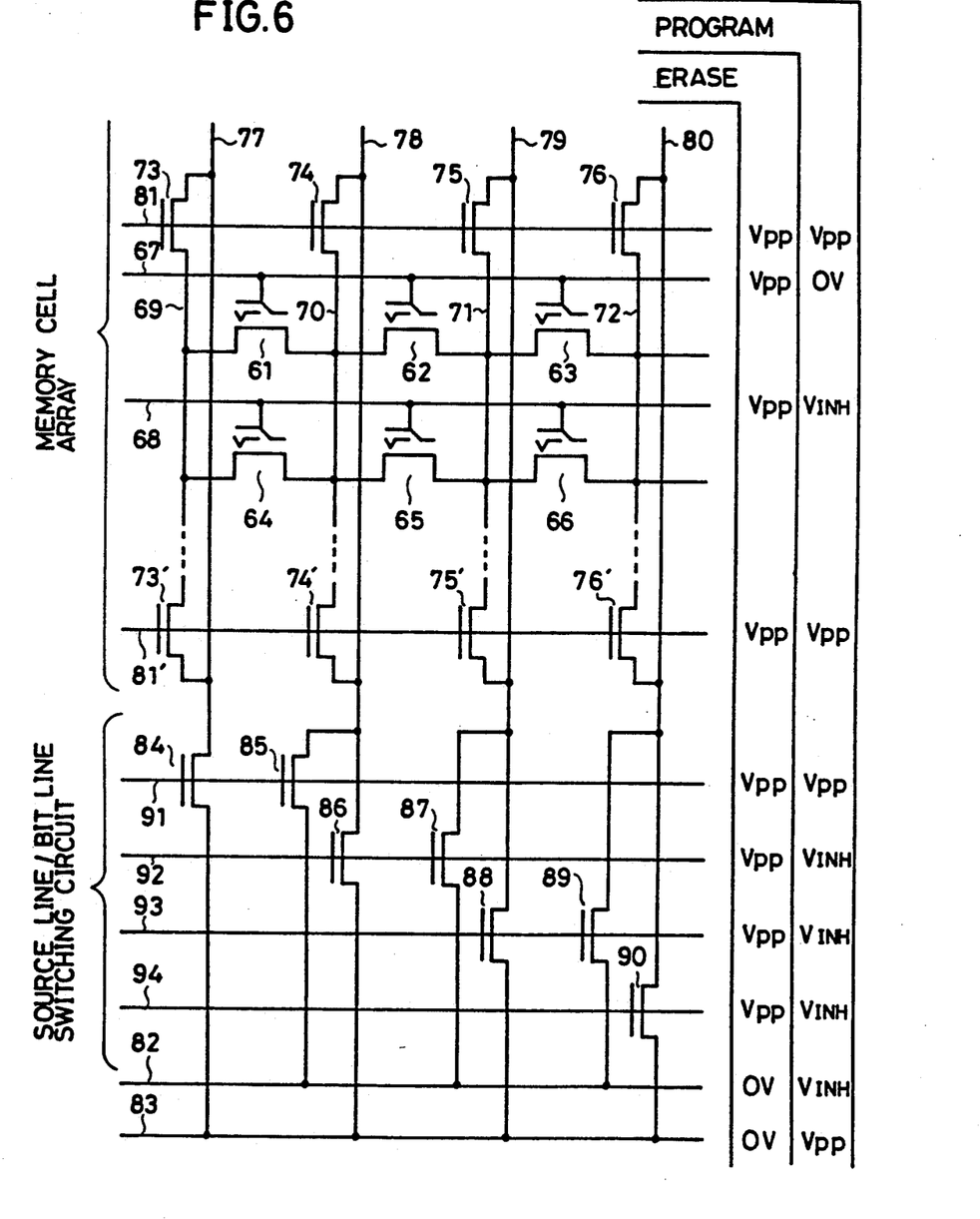
FIG. 6 is a diagram showing a part of memory cell array structure in the third embodiment of the present invention.

FIG. 6 is a diagram showing a structure of a third embodiment of the present invention achieved in order to solve such a problem as occurs in the embodiment shown in FIG. 3 and FIG. 4. In the drawing, memory cells 61–66 each comprising a floating gate transistor are provided in the same sector. A word line 67 is connected to each control gate of the memory cells 61–63. A word line 68 is connected to each control gate of the memory cells 64–66. Each drain of the memory cells 61 and 64 is connected to a sub bit line 69 and each drain of the memory cells 62 and 65 is connected to a sub bit line 70 and each drain of the memory cells 63 and 66 is connected to a sub bit line 71. Each source of the memory cells 61 and 64 is connected to the sub bit line 70, each source of the memory cells 62 and 65 is connected to the sub bit line 71 and each source of the memory cells 63 and 66 is connected to a sub bit line 72. The sub bit line 69 has one end connected to a main bit line 77 through a sector selecting transistor 73 and the other end connected to the main bit line 77 through a sector selecting transistor 73'. Similarly, the sub bit lines 70, 71 and 72 are connected to main bit lines 78, 79 and 80, respectively at their ends on one side through sector selecting transistors 74, 75 and 76, respectively and at the other ends through sector selecting transistors 74' and 75' and 76', respectively. Each gate of the sector selecting transistors 73, 74, 75 and 76 is connected to a sector selecting line 81, and each gate of the sector selecting transistors 64, 65 and 66 is connected to a sector selecting line 81'. The sector selecting lines 81 and 81', not shown however, are connected with each other to receive the same sector selecting signal. One sector is formed according to the above described configuration, and a plurality of such sectors of such configuration are arranged in a memory cell array.

The main bit line 77 is connected to an I/O line 83 through a transistor 84. The main bit line 78 is connected to a source line 82 through a transistor 85 and to the I/O line 83 through a transistor 86. The main bit line 79 is connected to the source line 82 through a transistor 87 and to the I/O line 83 through a transistor 88. The main bit line 80 is connected to the source line 82 through a transistor 89 and to the I/O line 83 through a transistor 90. Each gate of the transistors 84 and 85 is connected to a Y gate selecting line 91. Each gate of the transistors 86 and 87 is connected to a Y gate selecting line 92. Each gate of the transistors 88 and 89 is connected to a Y gate selecting line 93. A gate of the transistor 90 is connected to a Y gate selecting line 94. Each of the Y gate selecting lines 91-94 receives the corresponding output from the column decoder. The transistors 84-90 constitute source line/bit line switching circuit.

As is clear from the foregoing description, in the embodiment of FIG. 6, the respective sources of the memory cells 61-66 are connected to the sub bit lines 70-72 in their adjacent columns, respectively, and unlike the embodiments in FIG. 3 and in FIG. 4, there exists no such source line 9 as connected to a source of each memory cell. The embodiment of FIG. 6 of such configuration is structured such that when a memory cell of a column in the same sector is selected, only the sub bit line belonging to the column functions as the original sub bit line and the other sub bit lines function as source lines. Therefore, a switching circuit for switching the functions of the sub bit lines is constituted by the transistors 84-90.

Now, operations of the embodiment shown in FIG. 6 will be described.

First, an erasing operation will be described. In this case, a high voltage $V_{PP}$ is applied to the word lines 67 and 68, the sector selecting lines 81 and 81' and the Y gate selecting lines 91-94 and 0 V is applied to the source line 82 and the I/O line 83. Accordingly, the high voltage $V_{PP}$ is applied to each control gate of the memory cells 61-66. In addition, all of the sector selecting transistors 73-76 and 73'-76, and the transistors 84-90 are conductive, and 0 V on the source line 82 and I/O line 83 is applied to each drain of the memory cells 61-66. As a result, a high voltage is applied between each drain and each control gate of all the memory cells 61-66 in the sector, whereby electrons are stored in each floating gate due to tunnel phenomenon. Therefore, a threshold voltage of each of the memory cells 61-66 becomes higher than that before the erasing operation. Meanwhile, a state of a memory cell in a non-selected sector (not shown) does not change.

Now, a description is given of a programming operation in which "0" is written in the memory cell 61. First, a writing blocking voltage $V_{INH}$ is applied to the source line 82 and a high voltage $V_{PP}$ is applied to the I/O line 83. Then, the high voltage $V_{PP}$ is applied to the Y gate selecting line 91 and the writing blocking voltage $V_{INH}$ is applied to the other Y gate selecting lines 92-94. Therefore, the transistors 84, 85, 87 and 89 become conductive and the transistors 86, 88 and 90 become non-conductive. In response thereto, the high voltage $V_{PP}$ on the I/O line 83 is applied to the main bit line 77 and the writing blocking voltage $V_{INH}$ on the source line 82 is applied to the other main bit lines 78-80. On this occasion, the high voltage $V_{PP}$ is being applied to the sector selecting lines 81 and 81', and all of the sector selecting transistors 73-76 and 73'-76' are conductive. As a result, the main bit lines 77-80 and the sub bit lines 69-72 are respectively connected with each other, the high voltage $V_{PP}$ is applied to the sub bit line 69 and the writing blocking voltage $V_{INH}$ is applied to the sub bit lines 70-72. On the other hand, 0 V is applied to the selected word line 67 and a writing blocking voltage $V_{INH}$ is applied to the non-selected word line 68. Accordingly, 0 V is applied to the control gate of the selected memory cell 61 and the high voltage $V_{PP}$ is applied to the drain thereof, so that the electrons stored in the floating gate of the memory cell 61 flow out due to tunnel phenomenon. As a result, the threshold voltage of the memory cell 61 goes lower than that of before programming, which is equivalent to the writing of the "0". Since no high voltage is applied between each drain and each control gate of the other memory cells 62-66, there occurs no tunnel phenomenon, so that "0" is not written.

Now, description will be given of a reading operation in which the information in the memory cell 61 is read. In reading the memory cell 61, a power supply voltage Vcc is applied to the sector selecting lines 81 and 81', the power supply voltage Vcc is applied to the selected word line 67, 0 V is applied to the non-selected word line 68, the power supply voltage Vcc is applied to the Y gate selecting line 91, 0 V is applied to the Y gate selecting lines 92-94 and 0 V is applied to the source line 82. In addition, the I/O line 83 is connected to a sense amplifier (not shown) and a reading voltage of about 1 to 2 V is applied on the line. In this state, the power supply voltage Vcc is applied to the control gate of the memory cell 61. In addition, the drain of the memory cell 61 is connected to a sense amplifier (not shown) through the sub bit line 69, the sector selecting transistors 73 and 73' the main bit line 77, the transistor 84 and the I/O line 83, and a reading voltage of about 1 to 2 V is applied thereto. 0 V is applied to the source of the memory cell 61 through the sub bit line 70, the sector selecting transistors 74 and 74', the main bit line 78, the transistor 85 and the source line 82. As a result, a reading path of the memory cell 61 is formed between the not-shown sense amplifier and the ground, so that the information stored in the memory cell 61 is read. With respect to the other memory cells 62-66, since the transistors 86-90 are non-conductive, no current path is formed between each drain and source of the memory cells 62-66, so that the stored information is not read.

Figure 7:
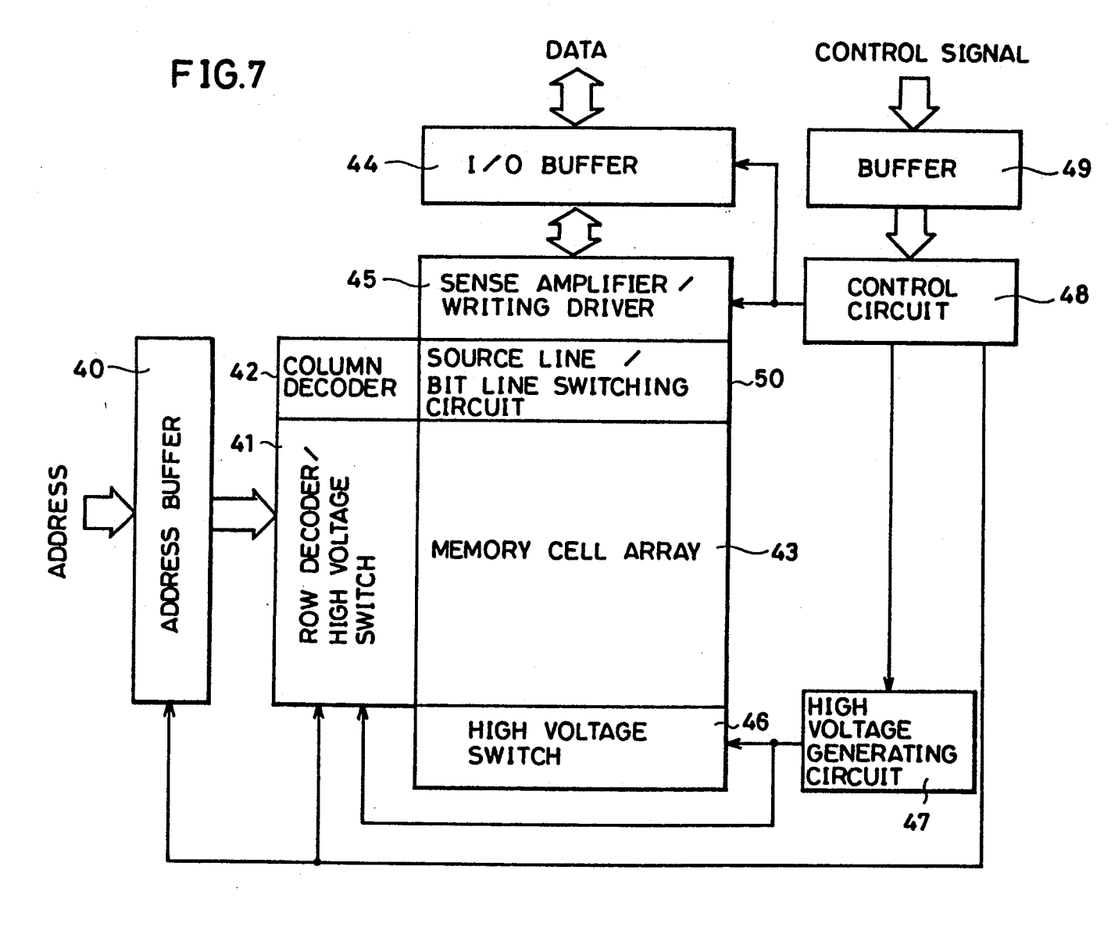
FIG. 7 is a block diagram showing a structure of the peripheral circuits for driving the embodiment shown in FIG. 6.

FIG. 7 is a block diagram showing a structure of a peripheral circuits for driving the memory cell array of the embodiment shown in FIG. 6. The structure of FIG. 7 is loaded in a single chip, as well as the device shown in FIG. 5. In the device shown in FIG. 7, a source line/bit line switching circuit 50 is provided for switching a function of its sub bit line in a selected sector between performing as a sub bit line and as a source line. The rest of the structure is the same as that of the device shown in FIG. 5.

According to the embodiment shown in FIGS. 6 and 7, since there is no need to interconnecting each source of memory cell transistors, reduction of a circuit area as well as simplification of interconnecting process becomes possible. In addition, the embodiment of FIG. 6 has the same effect as that of the embodiment shown in FIG. 4.

Although in the embodiment shown in FIG. 6, two sector selecting transistors are provided in each column of the same selector, one or three or more transistors may be provided, and furthermore, may be provided in other locations than the opposite ends of each sub bit line.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device for storing information in a non-volatile manner and being electrically alterable, comprising:
   a memory cell array having a plurality of memory cell transistors disposed in matrix in a direction of row and column, and divided into a plurality of sectors each comprising a predetermined plural number of rows;
   each of said plurality of memory cell transistors comprising a drain, a source, a control gate, and a floating gate;
   a plurality of word lines provided in rows of said memory cell array, each word lie being connected to control gates of the memory cell transistors in a corresponding row;
   a plurality of main bit lines each of which is provided for a column of said memory cell array;
   a plurality of sub bit lines provided in columns of each sector of said memory cell array, each sub bit line being connected to drains of the memory cell transistors in a corresponding sector and column such that a plurality of memory cell transistors are connected in parallel to each sub bit line;
   a plurality of sector selecting transistors including a predetermined number of sector selecting transistors provided for each of said sub bit lines, each sector selecting transistor having its drain connected to the main bit line of a corresponding column, and its source connected to a corresponding sub bit line;
   a plurality of sector selecting lines, at least one provided for each sector of said memory cell array and connected to gates of the sector selecting transistors in a corresponding sector;
   means for providing sector select signals to said sector selecting lines to select one of said sectors; and
   write inhibiting voltage supplying means for supplying a write inhibiting voltage to non-selected word lines in the selected sector during a writing operation.

2. A non-volatile semiconductor memory device according to claim 1, wherein
   each of said plurality of sector selecting transistors is provided for one of said sub bit lines.

3. A non-volatile semiconductor memory device according to claim 1, wherein
   said plurality of sector selecting transistors comprise a plurality of sets of sector selecting transistors, each set comprising a plurality of transistors being provided for one of said sub bit lines.

4. A non-volatile semiconductor memory device according to claim 3, wherein
   the plurality of sector selecting transistors in each set are provided at opposite ends of each of said sub bit lines.

5. A non-volatile semiconductor memory device according to claim 1, wherein
   each of said plurality of main bit lines is formed of metal.

6. A non-volatile semiconductor memory device according to claim 1, wherein a number of said sub bit lines are also connected to sources of said memory cell transistors in columns adjacent to said corresponding column.

7. A non-volatile semiconductor memory device for storing information in a non-volatile manner, and being electrically alterable, comprising:
   a memory cell array having a plurality of memory cell transistors disposed in matrix in a direction f row and column, and divided into a plurality of sectors each comprising a predetermined number of rows,
   each of said memory cell transistors having a drain, a source, a control gate and a floating gate;
   a plurality of word lies provide din rows of said memory cell array, each word line being connected to control gates of the memory cell transistors in a corresponding row;
   a plurality of main bit lines each of which is provided for a column of said memory cell array;
   a plurality of sub bit lines provided in columns in each sector of said memory cell array, each sub bit line being connected to drains of the memory cell transistors in a corresponding sector and column such that a plurality of memory cell transistors are connected in parallel to each sub bit line, a number of sub bit lines also being connected to sources of the memory cell transistors in the adjacent column;
   a plurality of sector selecting transistors, including a predetermined number of selecting transistors provided for each of said sub bit lines, each selecting transistor having its drain connected to the main bit line of the corresponding column and its source connected to the corresponding sub bit line;
   a plurality of sector selecting lines, at least one provided for each of said sectors of said memory cell array and connected to gates of the sector selecting transistors in a corresponding sector;
   means for providing sector select signals to said sector selecting lines to select one of said sectors; and
   write inhibiting voltage supplying means for supplying a write inhibiting voltage to non-selected word lines in the selected sector during a writing operation.

8. A non-volatile semiconductor memory device according to claim 7, wherein
   each of said plurality of sector selecting transistors is provided for one of said sub bit lines.

9. A non-volatile semiconductor memory device according to claim 7, wherein said plurality of sector selecting transistors comprises a plurality of sets of sector selecting transistors, each set comprising a plurality of transistors provided for one of said sub bit lines.

10. A non-volatile semiconductor memory device according to claim 9, wherein
the plurality of sector selecting transistors in each set are provided at opposite ends of each of said sub bit lines.

11. A non-volatile semiconductor memory device comprising:
 a plurality of bit lines;
 a plurality of word lines arranged to intersect said bit lines; and
 a plurality of electrically alterable memory cells, one memory cell being arranged at each intersection of said word lines and said bit lines;
 each of said plurality of bit lines comprising:
  a main bit line for transmitting a column selection signal, and
  a plurality of auxiliary bit lines wherein a plurality of the memory cells are connected in parallel to each sub bit line;
 said non-volatile semiconductor memory further including a plurality of sector selection transistor means for selectively connecting respective ones of said main bit lines and corresponding ones of said auxiliary bit lines to define sectors of said non-volatile semiconductor memory;
 means for providing sector select signals to said sector selection transistor means to select one of said sectors; and
 write inhibiting voltage supplying means for supplying a write inhibiting voltage to non-selected word lines in the selected sector during a writing operation.

12. In a non-volatile memory having a matrix of floating gate transistor memory cells arranged in rows and columns, a plurality of word lines connected to control gates of said memory cells and a plurality of bit lines connected to drains of said memory cells, the improvement comprising:
 a plurality of sectors of said non-volatile memory each having a matrix of said floating gate transistor memory cells arranged in rows and columns, a plurality of said word lines connected to respective groups of said control gates of said memory cells and a plurality of said bit lines connected to respective groups of drains of said memory cells within respective sectors and configured as sub-bit lines within said non-volatile memory, a plurality of memory cells being connected in parallel to each sub bit line,
 a plurality of main bit lines corresponding to respective bits of all sectors of said non-volatile memory such that each main bit line corresponds to a column of the matrix of floating gate transistor memory cells,
 a plurality of sector-selection lines,
 a plurality of sector-selecting transistors having control electrodes thereof connected to said sector selection lines, a first conduction electrode connected to a respective one of said main bit lines and a second conduction electrode thereof connected to a second conduction electrode thereof connected to a corresponding one of said sub-bit lies of one sector of said non-volatile memory,
 means for providing sector select signals to said sector-selection lines to select one of said sectors,
 means for providing erase signals to the main bit lines and though sector-selecting transistors to the sub-bit lines of the selected sector during erasing, and
 write inhibiting voltage supplying means for supplying a write inhibiting voltage to non-selected word lines in the selected sector during a writing operation,
 whereby said non-volatile memory can be erased and written, in a page mode by sectors and the capacity of said non-volatile memory may be increased without reducing operating margins for voltage fluctuation during said erasing and writing.

13. A method of increasing at least one of capacity and operating margins of a non-volatile semiconductor memory having floating gate memory cells arranged in rows corresponding to word lines and columns corresponding to bit lines and in which writing after erasure is carried out in a page mode, by rows, corresponding to each of said word lines comprising the steps of:
 defining sectors of said non-volatile semiconductor memory, each said sector corresponding to a plurality of word lines which is less than the total number of word lines of said non-volatile semiconductor memory,
 selectively supplying program signals and erasure signals to one of a plurality of main bit lines, one main bit line corresponding to each column of the non-volatile semiconductor memory,
 selecting, at one time, less than all sectors of said non-volatile semiconductor memory during erasure and writing of said non-volatile semiconductor memory by activating at least one of a plurality of sub bit lines each of which is connected in parallel to a plurality of floating gate memory cells and receives signals from a corresponding main bit line, and
 supplying a write inhibiting voltage to non-selected word lines in said selected less than all sectors during the writing of said non-volatile semiconductor memory,
 whereby the number of repetitions of non-selection of a particular memory cell is reduced during said erasure and writing, in a page mode, of said non-volatile semiconductor memory and capacity may be expanded without reduction of operating margins.

14. A non-volatile semiconductor memory device comprising:
 a plurality of bit lines arranged to form columns,
 a plurality of word lines arranged to intersect said bit lines arranged to form rows,
 a plurality of memory cells, one memory cell being arranged at each intersection of said word lines and said bit lines, wherein the improvement comprises:
 a plurality of main bit lines for transmitting a column selection signal, each of which is provided for a single column of said memory cells,
 a plurality of bit lines arranged as auxiliary bit lines and controlled by said main bit lines, a plurality of memory cells being connected in parallel to each auxiliary bit line,
 a plurality of sector selection transistor means for selectively connecting said main bit lines and corresponding auxiliary bit lines to define sectors of said non-volatile semiconductor memory, means for providing sector select signals to said sector selection transistor means to select one of said sectors, means for providing erase signals to the main bit lines and through sector-selecting transistors to the auxiliary-bit lines of the selected sector during erasing, and write inhibiting voltage supplying means for supplying a write inhibiting voltage to non-selected word lines in the selected sector during a writing operation, whereby erasing and writing of said non-volatile memory can be done in a page mode in sectors to increase operating margins in respect to voltage fluctuations in floating gates of non-selected memory cells during said writing of data into said non-volatile memory in memory cells corresponding to each of said word lines in a sector in which said writing is done.

15. A non-volatile semiconductor memory as recited in claim 14, wherein the improvement further comprises:

a further plurality of main bit lines for transmitting a row selection signal, a further plurality of said bit lines arranged as auxiliary bit lines and controlled by said main bit lines, and a further plurality of sector selection transistor means for selectively connecting said main bit lines and said auxiliary bit lines to define further sectors of said non-volatile semiconductor memory, whereby said non-volatile memory can be erased and written, in a page mode by sectors and the capacity of said non-volatile memory may be increased without reducing operating margins for voltage fluctuation during said erasing and writing.

16. A non-volatile semiconductor memory device for storing information in a non-volatile manner and being electrically alterable, comprising:

a memory cell array having a plurality of memory cell transistors disposed in matrix in a direction of row and column, and divided into a plurality of sectors each comprising a predetermined plural number of rows;

each of said plurality of memory cell transistors comprising a drain, a source, a control gate, and a floating gate;

a plurality of word lines provide din rows of said memory cell array each word line being connected to control gates of the memory cell transistors in a corresponding row;

a plurality of main bit lines each of which is provided for a column of said memory cell array;

a plurality of sub bit lines provided in columns of each sector of said memory cell array, each sub bit line being connected to drains of the memory cell transistors in a corresponding sector and column such that a plurality of memory cell transistors are connected in parallel to each sub bit line;

a plurality of sector selecting transistors including a predetermined number of sector selecting transistors provided for each of said sub bit lines, each sector selecting transistor having its drain connected to the main bit line of a corresponding column, and its source connected to a corresponding sub bit line;

a plurality of sector selecting lines, at least one provided for each sector of said memory cell array and connected to gates of the sector selecting transistors in a corresponding sector;

programming means for selectively supplying a program signal to said main bit lines;

means for providing sector select signals to said sector selecting lines for selectively supplying said programming signal to at least one of said sub bit lines of a selected sector; and write inhibiting voltage supplying means for supplying a write inhibiting voltage to non-selected word lines in the selected sector during programming.

17. A non-volatile semiconductor memory device for storing information in a non-volatile manner, comprising:

a plurality of memory cell transistors disposed in a matrix of a plurality of rows and a plurality of columns, and divided into a plurality of sectors each comprising a predetermined number of rows, each memory cell transistor having a control gate and a floating gate;

a plurality of word lines disposed in a plurality of rows, each word line being connected to control gates of a plurality of memory cell transistors arranged in the corresponding row;

a plurality of sub bit lines groups provided for said plurality of sectors, each sub bit line group having a plurality of but bit lines arrange din a plurality of columns of the corresponding sectors, each sub bit line being connected to a plurality of memory cell transistor sin the corresponding column of the corresponding sector;

a plurality of main bit lines arranged in a plurality of columns;

a plurality of sector selecting transistor groups arranged in a plurality of columns, each sector selecting transistor group having a plurality of sector selecting transistors provided for a plurality of sectors, each sector selecting transistor connected between said main bit lie arranged in a corresponding column of the matrix and a sub bit line arranged in the corresponding column of the corresponding sector;

a plurality of sector selecting lines provided for a plurality of sectors, each sector selecting line connected to the control gates of a plurality of said sector selecting transistors arranged in the corresponding sector;

means for providing sector select signals to said sector selecting lines to select one of said sectors; and write inhibiting voltage supplying means for supplying a write inhibiting voltage to non-selected word line sin the selected sector during a writing operation.

* * * * *